(12) United States Patent
So et al.

(10) Patent No.: US 7,072,201 B2
(45) Date of Patent: Jul. 4, 2006

(54) MEMORY MODULE

(75) Inventors: Byung-se So, Seongnam (KR);
Jeong-hyeon Cho, Seoul (KR);
Jung-joon Lee, Seoul (KR); Jae-jun Lee, Yongin (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 10/853,353

(22) Filed: May 26, 2004

(65) Prior Publication Data

US 2005/0036350 A1 Feb. 17, 2005

(30) Foreign Application Priority Data

Aug. 13, 2003 (KR) ........................ 10-2003-0056012

(51) Int. Cl.
*G11C 5/06* (2006.01)

(52) U.S. Cl. .............................. 365/63; 365/51; 365/99

(58) Field of Classification Search .................. 365/63, 365/51, 99, 189.03, 191, 230.01, 233; 361/736
See application file for complete search history.

(56) References Cited

U.S. PATENT DOCUMENTS

| 5,949,657 | A | * | 9/1999 | Karabatsos | 361/803 |
|---|---|---|---|---|---|
| 5,953,215 | A | * | 9/1999 | Karabatsos | 361/767 |
| 6,021,048 | A | * | 2/2000 | Smith | 361/736 |
| 6,324,071 | B1 | * | 11/2001 | Weber et al. | 361/785 |
| 6,411,539 | B1 | * | 6/2002 | Funaba et al. | 365/63 |
| 6,487,102 | B1 | | 11/2002 | Halbert et al. | |
| 6,502,161 | B1 | * | 12/2002 | Perego et al. | 711/5 |
| 6,553,450 | B1 | | 4/2003 | Dodd et al. | |
| 2003/0035312 | A1 | * | 2/2003 | Halbert et al. | 365/51 |
| 2003/0048616 | A1 | * | 3/2003 | Ko et al. | 361/736 |
| 2004/0085795 | A1 | * | 5/2004 | Braun et al. | 365/51 |

FOREIGN PATENT DOCUMENTS

KR 2002-0071734 9/2002

OTHER PUBLICATIONS

Korean Office Action dated Sep. 30, 2005 (with English translation).

* cited by examiner

*Primary Examiner*—Tuan T. Nguyen
*Assistant Examiner*—Dang Nguyen

(74) *Attorney, Agent, or Firm*—Harness, Dickey & Pierce, P.L.C.

(57) ABSTRACT

In the memory module, a buffer is disposed on one of at least two circuit boards in the memory module. The buffer is for buffering signals for memory chips on at least two circuit boards in the memory module.

21 Claims, 6 Drawing Sheets

MEMORY MODULE

CROSS-REFERENCE TO RELATED APPLICATIONS

This U.S. nonprovisional patent application claims priority under 35 U.S.C. § 119 of Korean Patent Application 2003-0056012 filed on Aug. 13, 2003, the entire contents of which are hereby incorporated by reference.

BACKGROUND OF THE INVENTION

Computer systems often contain one or more integrated circuit (IC) chipsets that are coupled to memory modules using a memory interface. The memory interface provides communication between the IC chipset such as a central processing unit (CPU) and the memory modules. The memory interface may include address bus-lines, command signal lines and data bus lines.

Initially, each memory module was made up of a single substrate with memory chips on one or both sides. However, increasing demand for high computer performance and capacity resulted in a demand for a larger and faster memory. To meet this demand single memory modules having two or more electrically connected substrates mounted substantially parallel to each other were developed. U.S. Pat. No. 5,949,657 discloses an example of this type of memory module. Besides multiple substrate memory modules, memory density was increased by stacking memory chips on the same substrate. U.S. Pat. No. 6,487,102 discloses an example of this chip stacking technique.

However, as the operating speed and number of memory modules and/or memory chips connected to the chipset increase, the increase in capacitive load may place a substantial limit on the amount and speed of the memory. To relieve these capacitive load effects, memory modules having a buffer or register to buffer the command and address lines were developed. Here, each substrate of the module includes such a buffer for relieving capacitive load effects. Again U.S. Pat. No. 6,487,102 provides an example of what is commonly referred to as a registered memory module.

More recent advances in memory modules have provided fully buffered memory modules. In a fully buffered memory module, the command and address lines associated with the memory chips of each substrate are buffered as in the registered memory modules, and another buffer on each substrate of the module buffers the data lines. Fully buffered memory modules are said to electrically isolate the memory module from the chipset. U.S. Pat. No. 6,553,450 discloses an example of a fully buffered memory module.

SUMMARY OF THE INVENTION

The memory module according to an example embodiment of the present invention includes at least first and second circuit boards opposing one another such that the first and second circuit boards have inner faces facing each other and outer faces facing away from each other. At least one of the inner and outer faces of the first circuit board supports a first plurality of memory chips, and at least one of the inner and outer faces of the second circuit board supports a second plurality of memory chips. An electrical connector electrically connects the second plurality of memory chips with the first circuit board. A buffer is disposed on one of the inner and outer faces of the first circuit board, and serves the first and second plurality of memory chips.

For example, in one embodiment, a fully buffered memory module is provided where the buffer buffers both the data and the command and address signals for the first and second plurality of memory chips.

Accordingly, in one embodiment of the present invention, a fully buffered memory module is provided using a single buffer for the entire module; thus reducing the need for multiple buffers and connections thereto.

BRIEF DESCRIPTION OF THE DRAWINGS

The present invention will become more fully understood from the detailed description given herein below and the accompanying drawings, wherein like elements are represented by like reference numerals, which are given by way of illustration only and thus are not limiting of the present invention and wherein.

DETAILED DESCRIPTION OF THE EMBODIMENTS

Figure 1:
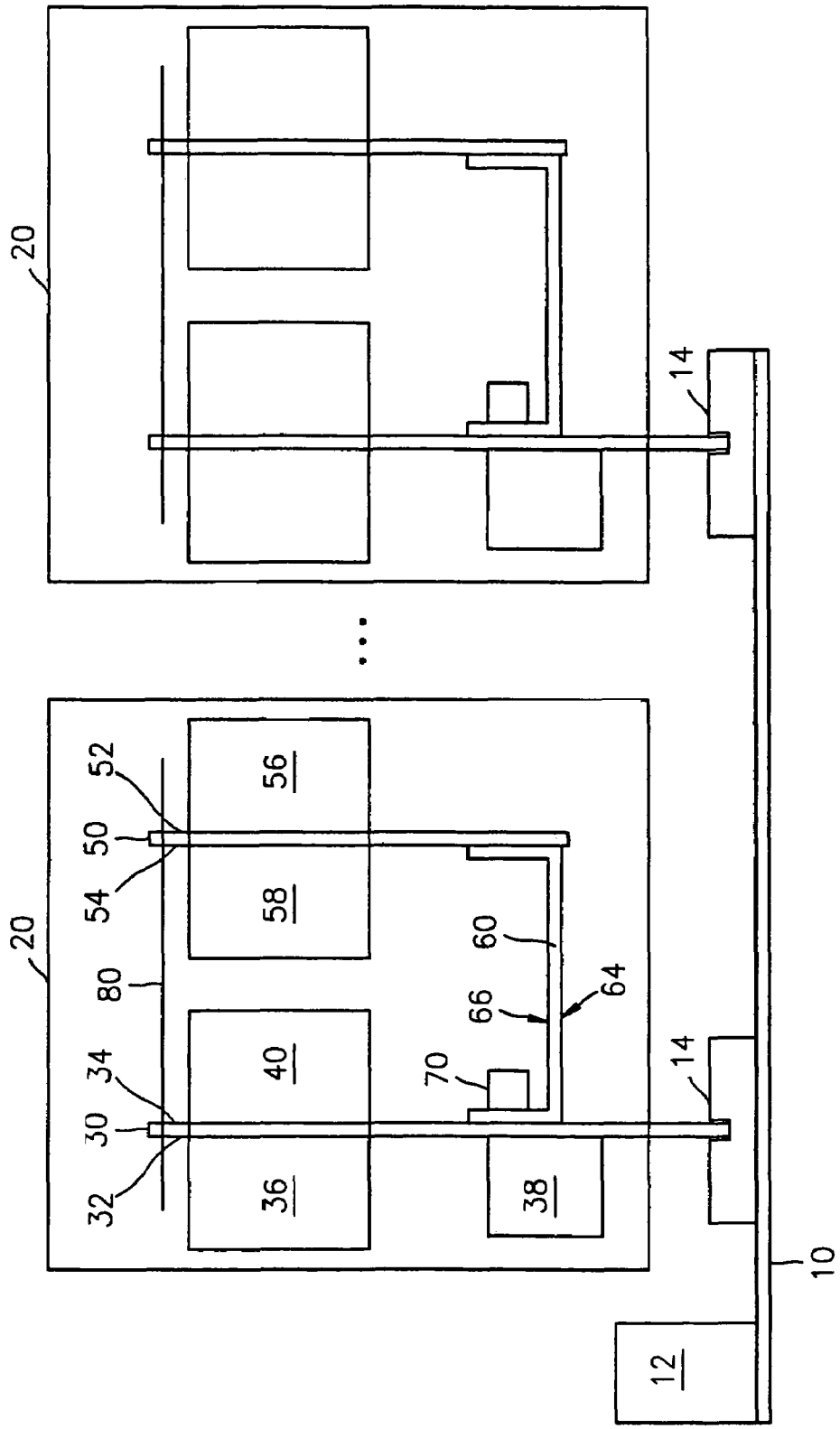
FIG. 1 illustrates an example of an embodiment of a memory module according to the present invention.

FIG. 1 illustrates an example of an embodiment of a memory module according to the present invention. As shown, a circuit board 10 includes a central processing unit (CPU) 12 and a number of slots 14. Each slot is capable of receiving a memory module 20. The circuit board 10 and slots 14 provide for electrically connecting the CPU 12 to memory modules 20 disposed in the slots 14.

As shown in FIG. 1, each slot 14 provides a female connector for receiving the male connecting portion of the memory module 20. Each memory module 20 includes a first circuit board 30 and a second circuit board 50 spaced apart from one another, but electrically and mechanically connected. The first circuit board 30 has an outer face 32 and an inner face 34. The outer face 32 supports at least one set of memory chips 36 forming a first rank and a buffer 38. The inner face 34 of the first circuit board 30 supports at least one set of memory chips 40 forming a second rank. A flexible connector 60 is electrically and mechanically attached to the inner face 34 of the first circuit board 30. Namely, a portion of the outer face 64 of the connector 60 is mechanically and electrically connected to the first circuit board 30. An inner face 66 of the connector 60 supports one or more registers 70 electrically connected thereto.

The second circuit board 50 has an outer face 52 and an inner face 54. The outer face supports a set of memory chips 56 forming a third rank and the inner face 54 also supports a set of memory chips 58 forming a fourth rank. A portion of the connector 60 is electrically and physically connected to the inner face 54 of the second circuit board 50. A pair of fasteners 80 also provides a mechanical connection between the first and second circuit boards 30 and 50. For example, the fasteners 80 may be posts mounted in vias of the first and second circuit boards 30 and 50.

Figure 2:
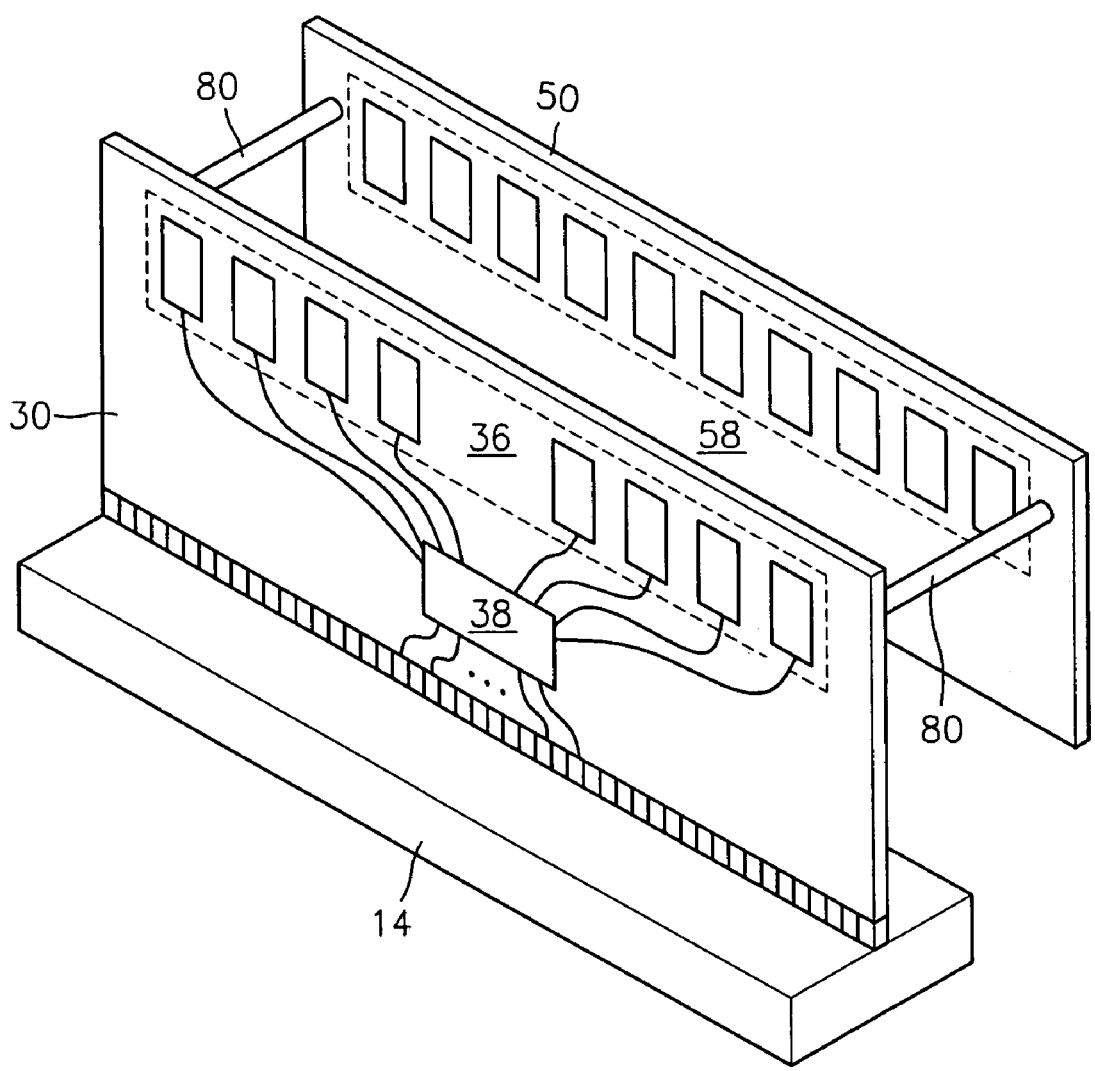
FIGS. 2 and 3 illustrate perspective views of the memory module in FIG. 1.
Figure 3:
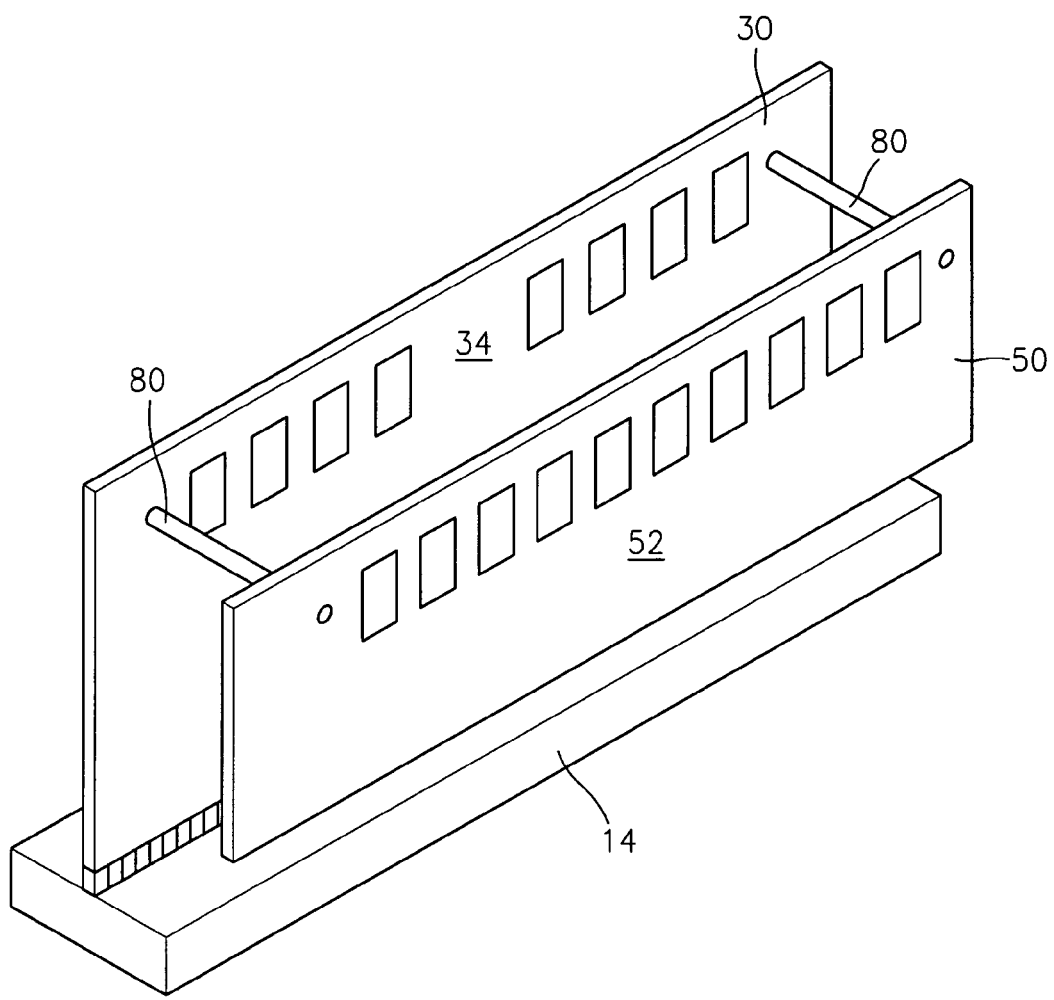

As explained above, FIG. 1 provides a side view of the mechanical structure of the memory module according to the present invention. FIG. 2 illustrates a perspective view of the memory module 20 from the outer surface 32 of the first circuit board 30. FIG. 3 illustrates another perspective view of the memory module 20 from the outer surface 52 of the second circuit board 50.

Next, the physical structure of the memory module will be described in more detail with respect to FIGS. 4–5.

Figure 4:
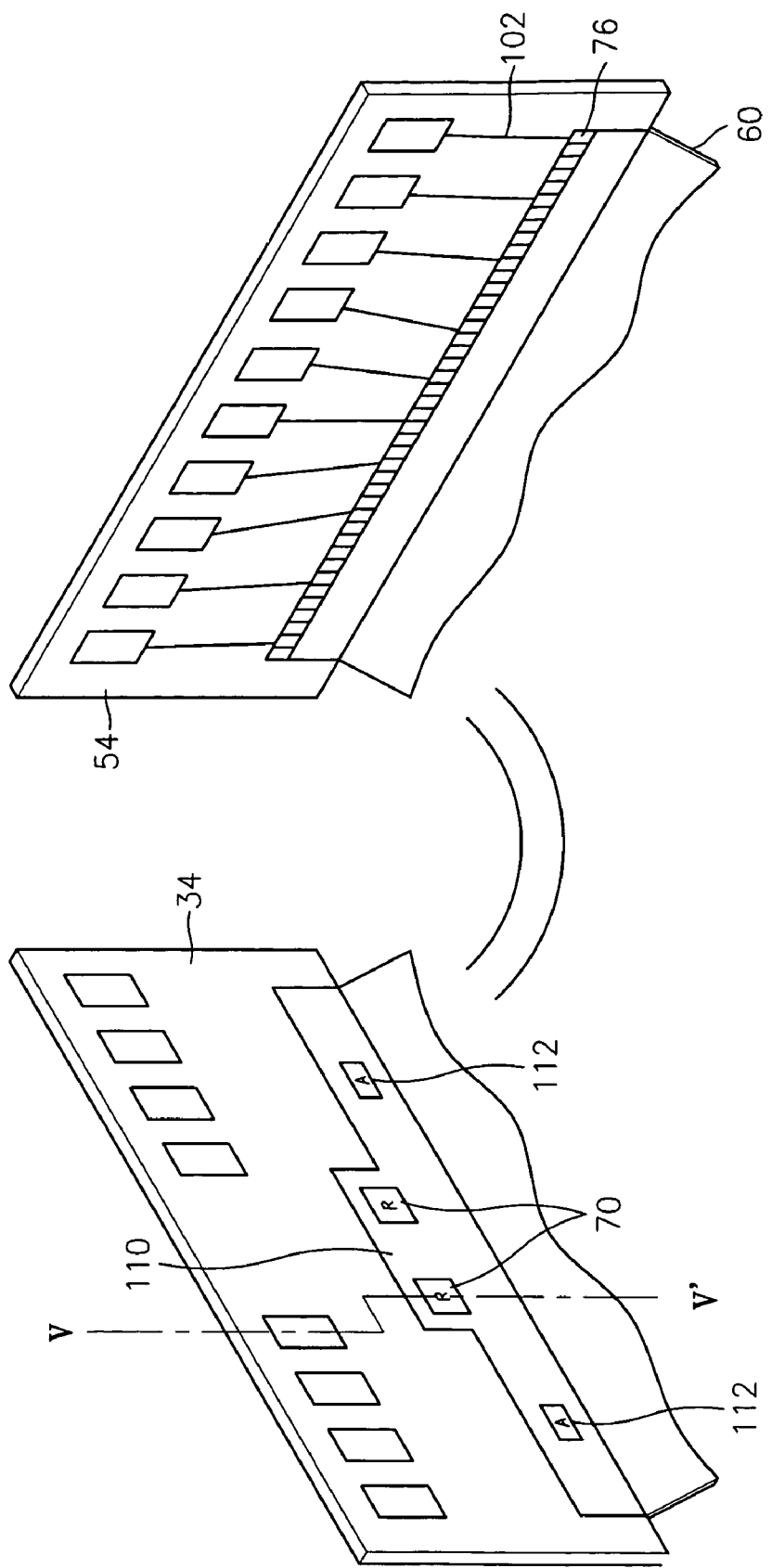
FIG. 4 illustrates the physical structure of a connection of a buffer to a first circuit board as well as the connection of a connector between the first circuit board and a second circuit board in the memory module of FIG. 1.

FIG. 4 illustrates a relational view of the inner surface 34 of the first circuit board 30 and the inner surface 54 of the second circuit board 50. As shown, the connector 60 attached to the inner surface 34 of the first circuit board 30 includes a tabbed portion 110 on which the registers 70 are connected. Furthermore, the non-tabbed portion of the connector 60 is physically attached to the inner surface 34 of the first circuit board 30 by adhesive 112.

FIG. 4 also shows the end of the connector 60 physically attached to the inner surface 54 of the second circuit board 50. The terminals 76 of the connector 60 provides for the mechanical connection as well as the electrical connection to the sets of memory chips 56 and 58. These electrical connections will be described in greater detail below with respect to FIG. 6.

Figure 5:
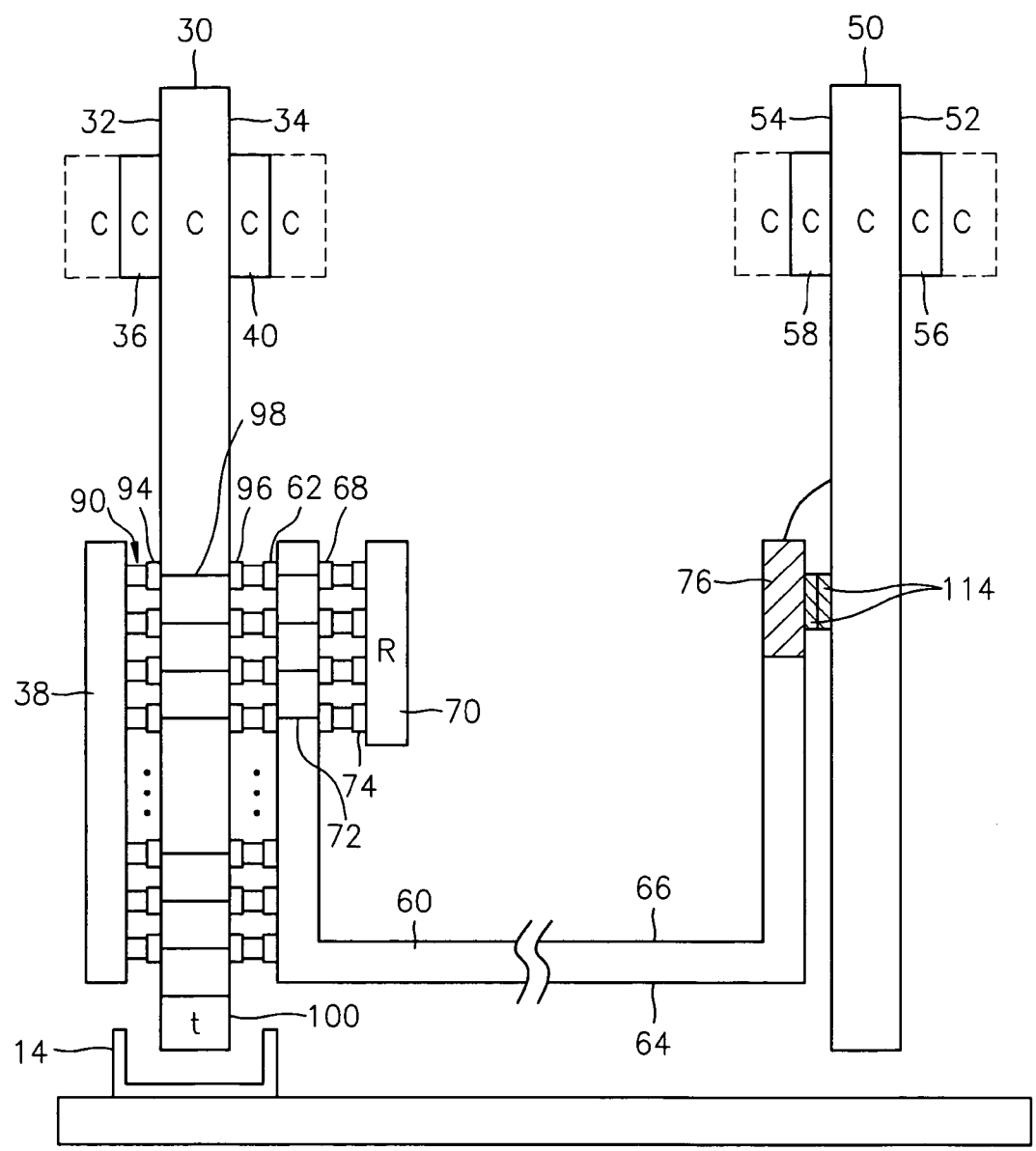
FIG. 5 illustrates a relational view of an inner surface of the first circuit board and the inner surface of the second circuit board in the memory module of FIG. 1.

FIG. 5 illustrates the physical structure of the connection of the buffer 38 to the first circuit board 30 as well as the connection of the connector 60 to the first and second circuit boards 30 and 50. Specifically, FIG. 5 provides an enlarged cross-sectional view, not to scale, of the memory module 20 along the cross-section line V–V' shown in FIG. 4. As shown, the buffer 38 is electrically and physically connected to the first circuit board 30. The buffer 38 includes a ball grid array 90 that is soldered to corresponding connection pads 94 on the outer surface 32 of the first circuit board 30. The first circuit board 30 includes conductive lines (not shown) that electrically connect appropriate ones of the connection pads 94 with the sets of memory chips 36 and 40. While not shown in FIG. 5, some of the conducting lines (not shown) are disposed in vias (not shown) in order to connect with the set of memory chips 40. Others of the connecting pads 94 are electrically connected to the terminals of the terminal end 100 of the first circuit board 30. The terminal end 100 provides electrical connection to a slot 14 when the memory module 20 is inserted in a slot 14.

As further shown in FIG. 5, still other connection pads 94 on the outer surface 32 are electrically connected to connection pads 96 on the inner surface 34 of the first circuit board 30. Specifically, conductors 98 formed in vias in the first circuit board 30 make this electrical connection. The connection pads 96 on the inner surface 34 are electrically connected to connection pads 62 of the flexible connector 60. The connection pads 96 and the connection pads 62 are soldered together to form an electrical and mechanical connection between the first circuit board 30 and the flexible connector 60. As shown in FIG. 5, some of the connection pads 62 on the outer surface of the connector 60 are electrically connected with connection pads 68 on the inner surface 66 of the connector 60. Conductors 72 formed in vias through the connector 60 provide the electrical connection between the connection pad 62 and the connection pads 68.

The registers 70 are electrically and mechanically connected to the connector 60. The registers 70 include a ball grid array 74 that is soldered to respective ones of the connection pad 68. Accordingly, the registers 70 are in electrical connection with the buffer 38 via the connector 60.

The flexible connector 60 provides an electrically conductive path between others of the connection pads 62 and terminals 76 at the end of the connector 60 with respect to the first circuit board 30. The terminals 76 are electrically connected with the sets of memory chips 56 and 58 by conductive lines (not shown) and provide the mechanical attachment between the connector 60 and the second circuit board 50 by the electrical contact 114. While not shown in FIG. 5, the conductive lines are formed on the inner surface 54 of the second circuit board 50, but also are disposed in vias (not shown) of the second circuit board 50 to provide an electrical connection with the set of memory chips 56. Accordingly, the physical structure of the memory module discussed above with respect to FIG. 5 provides the electrical connections as depicted in detail in FIG. 6.

Figure 6:
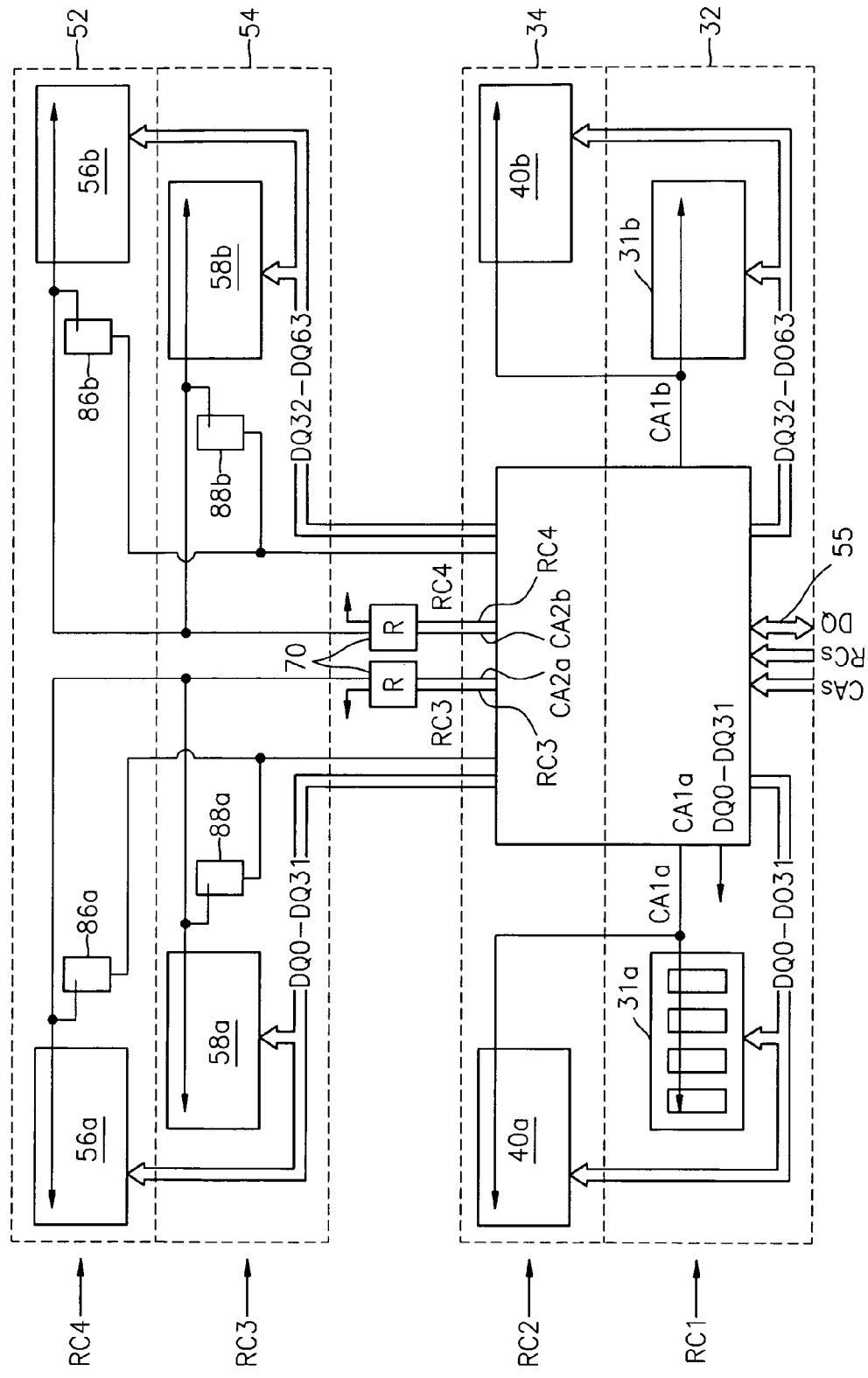
FIG. 6 illustrates the electrical connections between the components of the memory module in FIG. 1.

FIG. 6 illustrates the electrical connections between the components described above with respect to FIG. 1. As shown, the first circuit board 30 has first and second ranks RC1 and RC2 of memory chips. The second circuit board 50 has third and fourth ranks RC3 and RC4 of memory chips. The first rank RC1 includes the set of memory chips 36 divided into first and second halves 36a and 36b. The second rank RC2 includes the set of memory chips 40 divided into first and second halves 40a and 40b. The third rank RC3 includes the set of memory chips 58 divided into first and second halves 58a and 58b. The fourth rank RC4 includes the set of memory chips 56 divided into first and second halves 56a and 56b. The ranks RC1–RC4 receive command and address (CA) signals from the CPU 12, and share a data (DQ) bus 55 with one another and the CPU 12. One of the four ranks RC1–RC4 is activated by respective rank control signals RCs, and the activated rank communicates data DQ over the DQ bus 55 with the CPU 12 based on the CA signals. The signals from the CPU 12 may be grouped into two kinds of signals, the CA signals and the rank control signals RCs. The CA signals are commonly provided to the ranks RC1–RC4, and the rank control signals RCs are signals to control each of the ranks separately. The CA signals include RAS, CAS, address signals, etc., and the rank control signals RCs include, for example, chip select signals CSs. The CA signals, rank control signals RCs, and the data signals DQs are buffered by the buffer 38 and provided to the ranks RC1–RC4. Specifically, in FIG. 6, the CA signals CA1a, CA1b, CA2a and CA2b are buffered signals supplied to the respective halves 36a and 40a, 36b and 40b, 58a and 56a, and 58b and 56b of the sets of memory chips, and the rank control signals RC1, RC2, RC3 and RC4 are buffered signals supplied to each of the ranks RC1–RC4, respectively.

FIG. 6 additionally shows that the register 70 buffers the third and fourth command and address signals CA2a and CA2b and also buffers the third and fourth rank control signals RC3 and RC4. Also shown in FIG. 6 is that each half 56a, 58a, 56b and 58b of the sets of memory chips 56 and 58 includes a check bit chip 86a, 88a, 86b, 88b associated with each half 56a, 58b, 56b, 58b of the sets of memory chips 56 and 58. The check bit chips 86a, 88a, 86b and 88b each receive the same command and address signals CA of the associated half of the sets of memory chips 56 and 58 as well as inputting or outputting check bit data. For example, the check bit chips 86a and 88a receive check bit data CB0–CB7, while the check bit chips 86b and 88b receive the check bit data CB8–CB15. This check bit data is received as part of the data signals DQ.

As demonstrated by FIG. 2, the memory module 20 provides a fully buffered memory module. In this embodiment the single buffer 38 provides for buffering of the data signals and the command and address signals for the sets of memory chips on both the first and second circuit boards 30 and 50.

The invention being thus described, it will be obvious that the same may be varied in many ways. Such variations are not to be regarded as a departure from the spirit and scope of the invention, and all such modifications as would be obvious to one skilled in the art are intended to be included within the scope of the present invention.

We claim:

1. A memory module, comprising:
   at least first and second circuit boards opposing one another such that the first and second circuit boards have inner faces facing each other and outer faces facing away from each other, the first circuit board including a connecting portion for connecting the memory module to a mother board;
   at least one of the inner and outer faces of the first circuit board supporting a first plurality of memory chips;
   at least one of the inner and outer faces of the second circuit board supporting a second plurality of memory chips;
   an electrical connector electrically connecting the first and second circuit boards; and
   a single buffer, disposed on only the first circuit board, for buffering signals for the first and second plurality of memory chips.

2. The memory module of claim 1, wherein the buffered signals include command and address signals.

3. The memory module of claim 2, wherein the buffered signals further include data signals.

4. The memory module of claim 2, wherein the electrical connector supports at least one register that buffers command and address signals output from the buffer for the second plurality of memory chips.

5. The memory module of claim 1, wherein the outer face of the first circuit board supports the buffer.

6. The memory module of claim 1, wherein the electrical connecter is attached to the inner face of the first circuit board and the inner face of the second circuit board.

7. The memory module of claim 6, wherein at least one register is electrically connected to an end portion of the electrical connector.

8. The memory module of claim 7, the register buffers command and address signals output from the buffer for the second plurality of memory chips.

9. The memory module of claim 1, further comprising:
   a register electrically connected with the buffer for buffering command and address signals for the second plurality of memory chips, and the register and the buffer positioned on opposite faces of the first circuit board.

10. A memory module, comprising:
    a first circuit board;
    a second circuit board;
    a first plurality of memory chips disposed on the first circuit board;
    a second plurality of memory chips disposed on the second circuit board;
    an electrical connector electrically connecting the first and second circuit boards; and
    a buffer disposed on only one of the first and second circuit boards, electrically connected to the electrical connector and buffering signals for the first and second plurality of memory chips.

11. A memory structure, comprising:
    a stacked memory module having more than one circuit board supporting memory chips, the circuit boards being electrically connected; and
    a buffer disposed on only one of the circuit boards for buffering signals for the memory chips on more than one of the circuit boards.

12. A stacked memory module, comprising:
    a buffer disposed on only one of at least two circuit boards in the memory module, the buffer for buffering signals for memory chips on at least two circuit boards in the memory module.

13. The memory module of claim 1, wherein the electrical connector is independent of the mother board.

14. The memory module of claim 6, wherein the electrical connector is independent of the mother board.

15. The memory module of claim 1, wherein the second circuit board does not include a connecting portion for connecting the second circuit board to the mother board.

16. The memory module of claim 1, wherein the connecting portion of the first circuit board is the only connecting portion for connecting the memory module to the mother board.

17. The memory module of claim 1, further comprising:
    at least one fastener mounted between the first and second circuit boards to provide a mechanical connection between the first and second circuit boards.

18. The memory module of claim 10, further comprising:
    at least one fastener mounted between the first and second circuit boards to provide a mechanical connection between the first and second circuit boards.

19. A memory module, comprising:
    at least first and second circuit boards opposing one another such that the first and second circuit boards have inner faces facing each other and outer faces facing away from each other, the first circuit board including a connecting portion for connecting the memory module to a mother board;
    at least one of the inner and outer faces of the first circuit board supporting a first plurality of memory chips;
    at least one of the inner and outer faces of the second circuit board supporting a second plurality of memory chips;
    an electrical connector electrically connecting the first and second circuit boards;
    a buffer disposed on the first circuit board, the buffer for buffering signals for the first and second plurality of memory chips; and
    a register electrically connected with the buffer for buffering command and address signals for the second plurality of memory chips, and the register and the buffer positioned on opposite faces of the first circuit board.

20. The memory module of claim 19, wherein the buffered signals include command and address signals.

21. The memory module of claim 20, wherein the buffered signals further include data signals.

* * * * *